(12) United States Patent
Gajda

(10) Patent No.: US 6,855,601 B2
(45) Date of Patent: Feb. 15, 2005

(54) TRENCH-GATE SEMICONDUCTOR DEVICES, AND THEIR MANUFACTURE

(75) Inventor: Mark A. Gajda, Stockport (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/733,214

(22) Filed: Dec. 11, 2003

(65) Prior Publication Data

US 2004/0124461 A1 Jul. 1, 2004

Related U.S. Application Data

(62) Division of application No. 10/197,651, filed on Jul. 17, 2002, now Pat. No. 6,707,100.

(30) Foreign Application Priority Data

Jul. 24, 2001 (GB) ............................................. 0117949

(51) Int. Cl.[7] ............................................. H01L 21/336
(52) U.S. Cl. ..................... 438/259; 438/268; 438/270; 438/271
(58) Field of Search ................................ 438/259, 268, 438/270, 271

(56) References Cited

U.S. PATENT DOCUMENTS

| | | | | | |
|---|---|---|---|---|---|
| 5,753,554 A | * | 5/1998 | Park | ..................... | 257/E21.548 |
| 6,051,468 A | * | 4/2000 | Hshieh | ..................... | 257/330 |
| 6,087,224 A | | 7/2000 | Luo | ..................... | 638/270 |
| 6,097,061 A | * | 8/2000 | Liu et al. | ..................... | 257/330 |
| 6,215,149 B1 | * | 4/2001 | Lee et al. | ..................... | 257/328 |
| 6,251,730 B1 | * | 6/2001 | Luo | ..................... | 257/E29.26 |
| 6,252,277 B1 | * | 6/2001 | Chan et al. | ..................... | 257/330 |
| 6,312,993 B1 | * | 11/2001 | Hshieh et al. | ..................... | 438/270 |
| 6,413,822 B2 | * | 7/2002 | Williams et al. | ..................... | 257/331 |
| 6,465,866 B2 | * | 10/2002 | Park et al. | ..................... | 257/510 |
| 6,476,444 B1 | * | 11/2002 | Min | ..................... | 257/330 |
| 6,479,357 B1 | * | 11/2002 | Jung | ..................... | 438/299 |
| 6,489,204 B1 | * | 12/2002 | Tsui | ..................... | 257/302 |
| 6,509,608 B1 | * | 1/2003 | Hueting | ..................... | 257/330 |
| 6,534,367 B2 | * | 3/2003 | Peake et al. | ..................... | 257/E21.384 |
| 6,586,800 B2 | * | 7/2003 | Brown | ..................... | 257/330 |

FOREIGN PATENT DOCUMENTS

| | | | | |
|---|---|---|---|---|
| DE | 19507146 A | 11/1996 | ............ | H01L/29/78 |
| WO | WO0165608 | 7/2001 | ............ | H01L/29/78 |
| WO | WO0215254 | 2/2002 | ............ | H01L/21/336 |

OTHER PUBLICATIONS

ISPSD' 2000 Proceedings, pp. 181–184.
Juang et al: "A process simplification scheme for fabricating self–aligned silicided trench–gate power MOSFETs" solid state Electronics, Elsevier Science Publishers, vol.45, No. 1, Jan. 2001, pp. 169–172.
Norstrom et al: "Formation of CoSi2 and TiSi2 on narrow poly–Si lines" Microelectronic engineering, vol. 14, No. 3–4, Sep. 1991, pp. 327–339.

* cited by examiner

Primary Examiner—William M. Brewster
(74) Attorney, Agent, or Firm—Aaron Waxler

(57) ABSTRACT

The trench-gate (11) of, for example, a cellular power MOSFET comprises doped poly-Si or other semiconductor material (11a) adjacent to the gate dielectric layer (17) adjacent to the channel-accommodating region (15) of the device. The gate (11) also comprises a sizeable silicide part (11b) that reduces gate resistance. This silicide part (11b) protrudes upwardly from the trench (20) over a distance (z) typically larger than the width (w) of the trench (20), so forming an upstanding part (11b) of a metal silicide material between its top and sidewalls above the level of the body surface (10a). The gate dielectric layer (17) at least adjacent to the channel-accommodating region (15) is protected from the metal silicide by at least the semiconductor part (11a) of the gate and by the protrusion (z) of the silicide part (11b) upwardly above the level of the body surface (10a). The height (z) of this silicide protrusion can be defined by a layer thickness of a mask (51,52; 510,520) with a window (51a, 510a) at which the trench (20) is etched. The silicide material may be deposited or grown in situ by alloying.

10 Claims, 4 Drawing Sheets

TRENCH-GATE SEMICONDUCTOR DEVICES, AND THEIR MANUFACTURE

This is a Divisional of application Ser. No. 10/197,651, filed Jul. 17, 2002 now U.S. Pat. No. 6,707,100.

This invention relates to trench-gate semiconductor devices, for example cellular power MOSFETs (insulated-gate field-effect transistors), and to their manufacture, wherein the gate comprises a metal silicide material.

Trench-gate semiconductor devices are known, comprising a gate trench that extends into a semiconductor body from a body surface, through a channel-accommodating region between a source region and an underlying drain region. The gate is capacitively coupled to the channel-accommodating region by an intermediate gate dielectric layer at a wall of the trench. United States patent specification U.S. Pat. No. 6,087,224 (our reference PHB34245) discloses an advantageous method of manufacturing such trench-gate semiconductor devices, using self-aligned masking techniques in a flexible device process with good reproducibility. In particular, narrow trench-gates can be formed, and the source region and a source contact window can be defined in a self-aligned manner with respect to this narrow trench. The whole contents of U.S. Pat. No. 6,087,224 are hereby incorporated herein as reference material.

The resistance of the trench-gate increases as its width is reduced. This becomes particularly important in large cellular layouts having a significant path length from a given cell to the gate metallisation. U.S. Pat. No. 6,087,224 discloses a wide variety of embodiments, including options on different gate materials. In its detailed examples the trench-gate is of doped polycrystalline silicon (commonly termed poly-Si), but U.S. Pat. No. 6,087,224 also discloses using other materials for the gate, such as a thin metal layer that forms a silicide with the poly-Si, or forming the whole gate of a metal instead of poly-Si.

Various approaches to the development of tungsten and tungsten silicide ($WSi_x$) as trench-gate materials are described in the ISPSD'2000 paper "Tungsten and Tungsten Silicide ($WSi_x$) as Gate Materials for Trench MOSFETs" by Ambadi et al., pages 181 to 184 of the Proceedings of 12th International Symposium on Power Semiconductor Devices & ICs, Toulouse, 22nd to 25th May 2000. Although promising low gate resistance, it is recognised that these metal/silicide gates pose significant process development and integration challenges. The whole contents of this ISPSD'2000 paper are hereby incorporated herein as reference material.

Thus, deposition of the metal or silicide directly on the gate dielectric (usually oxide) is problematic in reducing the work function, and hence changing the threshold voltage of the device. Furthermore, contaminants such as fluorine can penetrate into the gate oxide from the deposited metal/silicide and can change the electrical properties of the gate oxide. Directly deposited silicides also suffer from poor adhesion to gate oxides. In attempting to avoid these problems, it is proposed in the ISPSD'2000 paper to deposit and/or grow different layer stacks within the gate trench, for example, a W layer on a barrier layer (Ti or TiN) on a very thin poly-Si layer on the gate oxide, and a W layer on a $WSi_x$ layer on a thin poly-Si layer on the gate oxide. These approaches are quite complex and not easy to integrate with other process steps in the device manufacture. Particularly with very narrow trenches, voids can occur in the gate, for example due to imperfect in-fill of the trench by the deposited layer stack, and/or by silicon diffusion from the poly-Si to the tungsten.

It is an aim of the present invention to provide an alternative silicide-gate structure that is well suited to the inclusion of a substantial silicide part (for reducing gate resistance) while avoiding and/or reducing many of these disadvantages of previous silicide gate schemes.

According to a first aspect of the present invention, there is provided a trench-gate semiconductor device, wherein the trench-gate comprises a part of semiconductor material adjacent to the gate dielectric layer adjacent to the channel-accommodating region of the device, the gate protrudes upwardly from the trench in the form of a silicide upstanding part which is of a metal silicide material between its top and sidewalls above the level of the body surface, and the gate dielectric layer at least adjacent to the channel-accommodating region is separated from the metal silicide material by at least the semiconductor part of the gate and by the protrusion of the silicide part upward above the level of the body surface.

The protrusion of the upstanding silicide part above the level of the body surface permits the inclusion of a substantial volume of silicide (to reduce gate resistance) without prejudicing other features such as: the quality of the gate dielectric adjacent to the channel-accommodating region; the device threshold voltage as determined by the semiconductor doping level of the lower gate part adjacent to this area of the gate dielectric; and good trench in-fill even with a very narrow trench. Generally, the protrusion of the silicide upstanding part of the gate above the level of the body surface may be larger than half the width of the trench. This protrusion may typically be as large as the width of the trench or larger, for example several times larger than the width of the trench.

Such a device structure in accordance with the invention is compatible with device manufacture using a variety of advantageous self-aligned processes, as described below.

According to a second aspect of the invention there is provided a manufacturing process that includes the following sequence of steps:

(a) providing at a surface of a semiconductor body a masking pattern having therein a window that is used for self-aligning a gate trench and parts of the gate formed in the subsequent steps (b) to (d);

(b) etching the trench into the semiconductor body within the window, and forming a dielectric layer at the walls of the trench for capacitively coupling the gate to the channel-accommodating region, (c) depositing and then etching back semiconductor gate material to provide the semiconductor gate material on the dielectric layer in the trench without protruding above the masking pattern at the window, and (d) then providing at the window a thickness of metal silicide material at the top of the semiconductor gate material sufficient to form a silicide upstanding gate part having a top and sidewalls that protrude upward above the level of the body surface.

The metal silicide material may be deposited on top of the semiconductor gate material in the trench, or it may be grown into the top and sidewalls of an upstanding part of the semiconductor gate material at the window. In either case, the gate dielectric layer (at least adjacent to the channel-accommodating region) is protected from the metal silicide by (at least a remaining part of) the semiconductor material of the gate and by the protrusion of its silicide part upward above the level of the body surface.

Sidewall extensions may be used to narrow the window where the silicide is provided, thereby laterally spacing the upstanding silicide part from the walls of the trench. Synergy with the advantageous method disclosed in U.S. Pat. No. 6,087,224 is possible. Thus, according to another aspect of the present invention, the said window of the masking pattern provided in step (a) may be a wide window that is then narrowed by providing sidewall extensions at the sidewalls of the wide window. The trench may be etched in step (b) at the narrower window, and the source region may be provided so as to be self-aligned with the trench-gate by means of the sidewall extensions. Depending on how the silicide is formed, these sidewall extensions may be retained or removed before providing the metal silicide in step (d). They and/or further sidewall extensions may be used in the definition of the silicide upstanding part of the gate.

According to a further aspect of the invention there is provided a manufacturing process that includes the following sequence of steps:

(a) providing at a surface of a semiconductor body a masking pattern comprising upper and lower layers through which a window extends at an area of the body where the trench-gate is to be provided, (b) etching a trench for the gate into the body at the window, and forming a gate dielectric layer at the walls of the trench, (c) providing silicon gate material in the trench and in the window, and then removing the upper layer of the masking pattern such that the silicon gate material has an upstanding upper part that protrudes above the adjacent surface of the lower layer of the masking pattern, (d) depositing a silicide-forming metal over the silicon gate material and over the lower layer of the masking pattern, and heating at least the metal to grow a metal silicide into the silicon gate material from the top and side-walls of the upstanding upper part, and (e) removing the un-silicided metal so as to leave a partially-silicided trench-gate protruding from the semiconductor body.

Both these aspects of the invention use a two-part masking pattern (either laterally as sidewall extensions at a wide window, or vertically as upper and lower layers). A two-part masking pattern of different materials can be particularly useful when the silicide material is provided by alloying a silicide-forming metal into an upstanding part of the semiconductor gate material in the window. Thus, the two-part masking pattern may be used when etching the trench and filling it with the semiconductor gate material to a level above the body surface. Thereafter one part of the two-part masking pattern may be removed (for example the sidewall extensions, and/or the upper layer), thereby creating a space for the silicide-forming metal to contact the sidewalls as well as the top of the upstanding part of the semiconductor gate material, and so to be alloyed therein.

Advantageous features in accordance with the present invention are set out in the appended Claims. These and other features in accordance with the present invention are illustrated in embodiments of the invention that are now described, by way of example, with reference to the accompanying drawings, in which:

Figure 1:
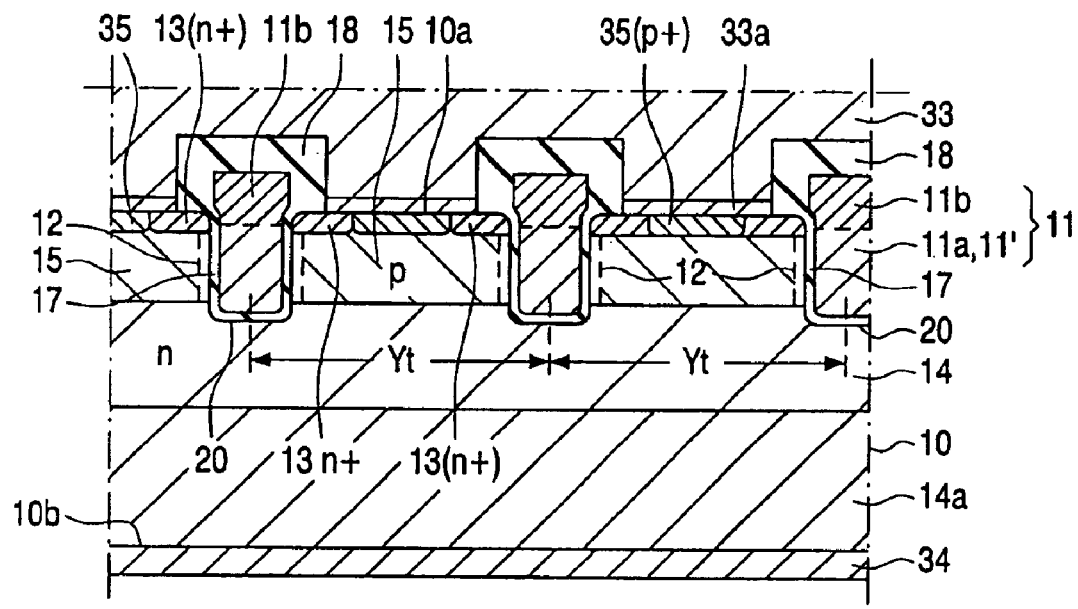
FIG. 1 is a cross-sectional view of an active central part of one example of a cellular trench-gate semiconductor device in accordance with the invention, having a silicide gate part.
Figure 4:
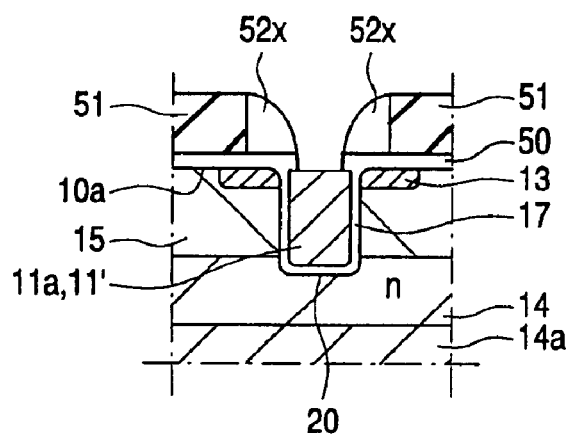
Figure 5:
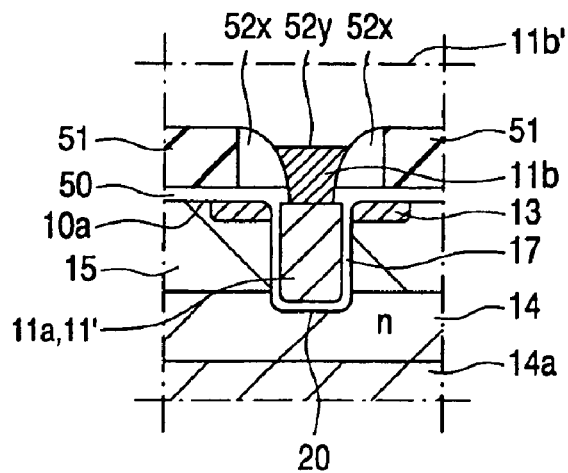
Figure 6:
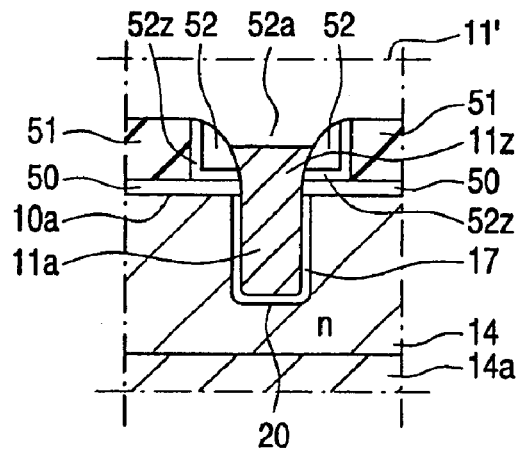
Figure 7:
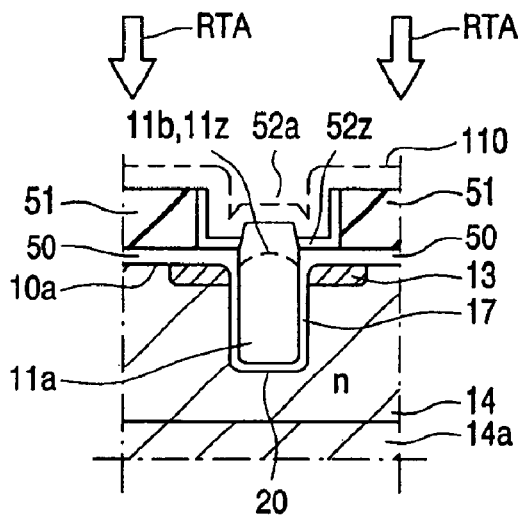
Figure 8:
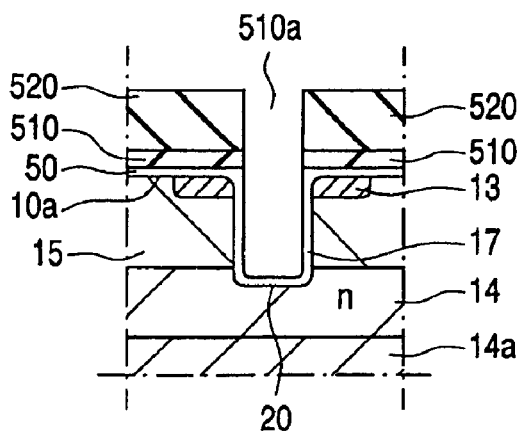
Figure 9:
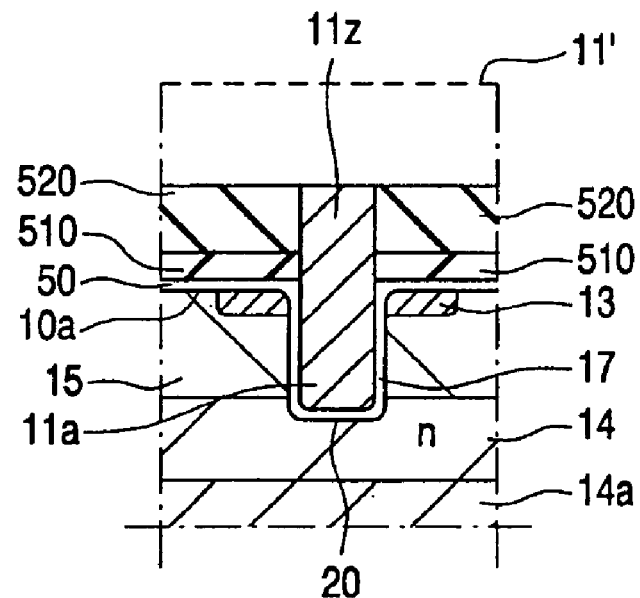
Figure 10:
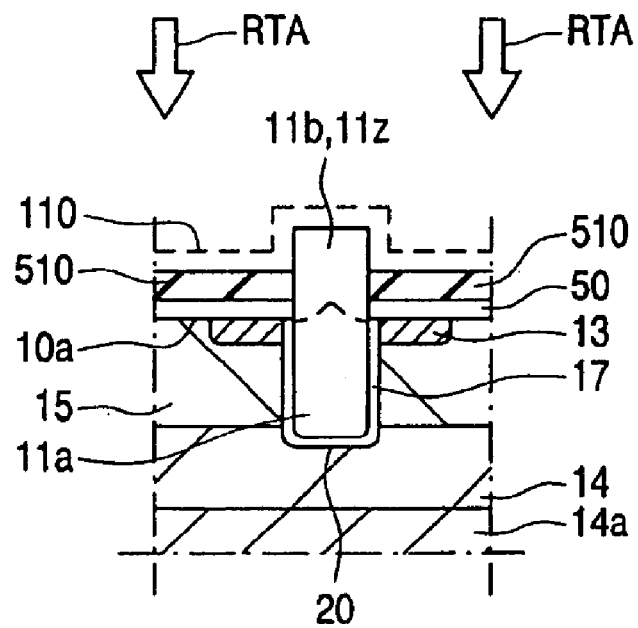

FIGS. 6 and 7 are cross-sectional views of modifications of FIGS. 4 and 5, in which the silicide is formed by alloying in a modified method also in accordance with the invention; and FIGS. 8 to 10 are cross-sectional views of a gate trench area of a device such as that of FIG. 1, at successive stages in its manufacture by a different example of a method in accordance with the invention, wherein the silicide is also formed by alloying.

It should be noted that all the Figures are diagrammatic, with the relative dimensions and proportions of various parts of these drawings being shown exaggerated or reduced in size, for the sake of clarity and convenience in the drawings. The same and/or related reference signs are generally used to refer to the same or corresponding or similar features in modified and different embodiments.

Figure 2:
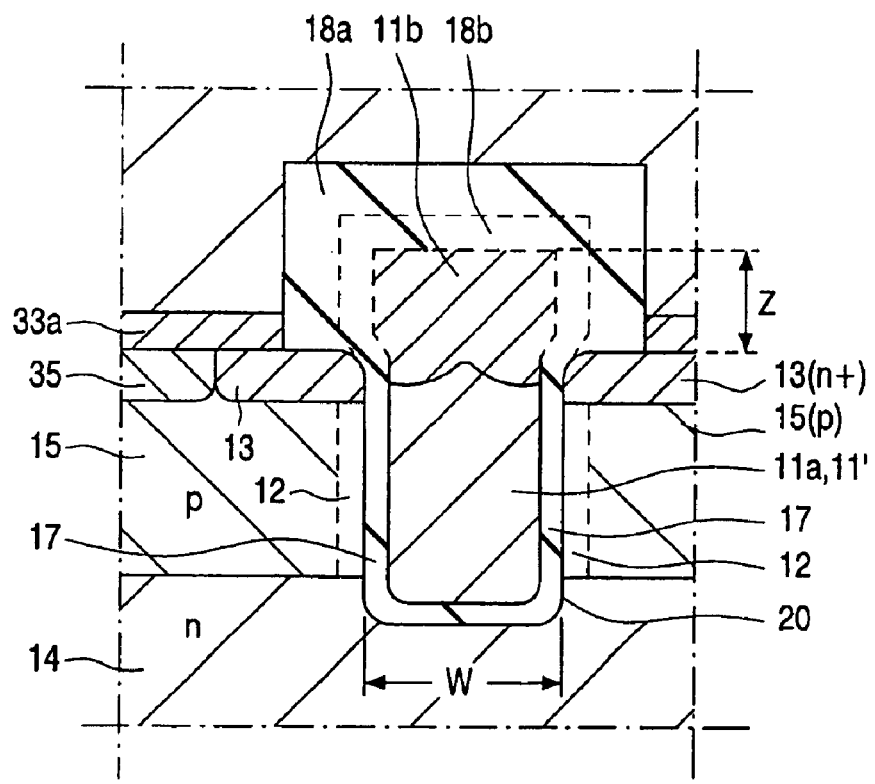
FIG. 2 is an enlarged cross-sectional view of a gate trench area in the device of FIG. 1.

Device Embodiment of FIGS. 1 and 2

FIG. 1 illustrates an example of a trench-gate cellular power MOSFET device in accordance with the invention. The device comprises a semiconductor body 10 having a body surface 10a from which a gate trench 20 extends into the body, through a channel-accommodating region 15 between a source region 13 and into an underlying drain region 14. Thus, in the transistor cell areas of this device, a channel-accommodating region 15 of a second conductivity type (i.e. p-type in this example) separates source and drain regions 13 and 14, respectively, of a first conductivity type (n-type in this example). The drain region 14 is common to all the cells.

The gate 11 is present in the trench 20 and is capacitively coupled to the region 15 by an intermediate dielectric layer 17 at the walls of the trench 20. A voltage signal applied to the gate 11 in the on-state of the device serves in known manner for inducing a conduction channel 12 in the region 15 and for controlling current flow in this conduction channel 12 between regions 13 and 14.

The source region 13 is located adjacent to the surface 10a, where regions 13 and 15 are contacted by a source electrode 33. The trench-gate 11 is insulated from the overlying electrode 33 by an intermediate insulating overlayer 18. FIG. 1 shows a vertical power device structure. The region 14 is a drain-drift region, formed by an epitaxial layer of high resistivity on a more highly-doped substrate 14a of the same conductivity type. This substrate 14a is contacted at the bottom major surface 10b of the device body 10 by a drain electrode 34.

No plan view of the cellular layout geometry is shown in the drawings, because the present invention may be used for quite different, known cell geometries. Thus, for example the cells may have any polygonal shape, for example a square geometry or a close-packed hexagonal geometry, or an elongate stripe geometry. In each case, the gate trench 20 extends around the boundary of each cell. The cell pitch (centre-to-centre spacing of the cells) is denoted as Yt in FIG. 1. FIG. 1 shows only a few cells, but typically the device comprises many thousands of these parallel cells between the electrodes 33 and 34. The active cellular area of the device may be bounded around the periphery of the device body 10 by various known peripheral termination schemes (also not shown). Such schemes normally include a thick field-oxide layer, formed in the peripheral device area at the surface 10a before the transistor cell fabrication steps. Furthermore, various known circuits (such as gate-control circuits) may be integrated with the device, between the active cellular area and the peripheral termination scheme.

Typically their circuit elements may be fabricated using some of the same masking and processing steps as are used for the transistor cells.

Typically the device body 10 is of monocrystalline silicon, and the gate dielectric layer 17 is of thermally grown silicon dioxide or deposited silicon dioxide. The gate 11 comprises a part 11a of doped semiconductor material 11' adjacent to the gate dielectric layer 17 adjacent to the channel-accommodating region 15. This semiconductor material 11' is typically highly-doped polycrystalline silicon (poly-Si), for example having a phosphorus or arsenic doping concentration (in an n-channel device) with a sheet resistance of about 10 $\Omega/\square$ (ohms per square).

In accordance with the present invention, the gate 11 protrudes upwardly from the trench 20 in the form of a silicide upstanding part 11b. This upstanding (i.e. proud) part 11b is of a metal silicide material between its top and sidewalls above the level of the body surface 10a. At least adjacent to the channel-accommodating region 15, the gate dielectric layer 17 is protected from the metal silicide material by the poly-Si part 11a and by the protrusion z of the silicide part 11b above the level of the body surface 10a. The poly-Si (or other semiconductor material) of the gate part 11a can in-fill even a narrow trench 20 without void formation and with good adhesion to the gate dielectric 17. The poly-Si part 11a acts as a buffer against contamination of the gate dielectric 17 when the silicide material is deposited or grown. Thus, the inclusion of the silicide as upstanding part 11b does not prejudice the field-effect control characteristics of the gate 11 and its dielectric 17 at the area where the channel 12 is formed in the region 15.

Typically, the protrusion z of the proud silicide part 11b may be at least as large as the width w of the trench 20 or larger. The protrusion z may be defined by a window in a mask whose thickness (and hence window depth) is in the range of, for example, about 0.4 $\mu$m (micrometres) to 1.5 $\mu$m. The width w of the gate trench 20 (which may be etched at this mask layer window) may be in the range of, for example, 0.7 $\mu$m to about 0.2 $\mu$m, or even 0.1 $\mu$m. Thus, the resulting ratio of z/w can be in the range of, for example, about 1 to 5, or more.

Such a protrusion z permits the inclusion of a large volume of the silicide material, thereby reducing significantly the gate resistance. The resistivity of the silicide material is typically an order of magnitude less than the doped poly-Si which is typically 800 $\Omega$.cm (ohm.centimetre). Thus, for example, the upstanding part 11b may be of titanium silicide having a resistivity in the range of 14 to 20 $\Omega$.cm, or tungsten silicide of 30 to 70 $\Omega$.cm.

The silicide part 11b may be located wholly above the level of the body surface 10a, because its upward protrusion z permits the inclusion of a large volume of the silicide material, thereby reducing the gate resistance as desired. However, as indicated in FIG. 2, the silicide part 11b may extend slightly below the level of the body surface 10a, and hence into the trench 20. This extension into the trench 20 is small, i.e. less than the depth of the source region 13.

The silicide part 11b may be deposited, or it may comprise a silicide-forming metal alloyed into the polycrystalline silicon 11' from the top and sidewalls of the upstanding part 11b. By way of example, FIG. 2 shows the bottom of the part 11b with a dimpled shape that is indicative of its formation by alloying metal into its top and sidewalls.

Regardless of whether its silicide part 11b is formed by deposition or alloying, the device of FIG. 1 is manufactured in accordance with the present invention by a method which includes the following sequence of steps:

(a) providing at surface 10a of a semiconductor wafer body 100 (that provides the device body 10) a masking pattern 51,52 or 510,520 having therein a window 51a or 510a that is used for self-aligning the trench 20 and parts 11a and 11b of the gate 11 formed in the subsequent steps (b) to (d);

(b) etching the trench 20 into the body 100 within the window 51a or 510a, and forming the gate dielectric layer 17 at the walls of the trench 20, (c) depositing and then etching back semiconductor gate material 11' to provide the semiconductor gate part 11a on the dielectric layer 17 in the trench 20 without protruding above the masking pattern 51,52 or 510,520 at the window 51a or 510a, and (d) then providing at the window 51a or 510a a sufficient thickness of metal silicide material at the top of the semiconductor gate material 11a in the trench 20 as to form the silicide upstanding part 11b having a top and sidewalls that protrude upward above the level of the body surface 10a.

During step (d) and thereafter, the gate dielectric layer 17 at least adjacent to the channel-accommodating region 15 is protected from the metal silicide material by the semiconductor part 11a and by the protrusion z of the silicide part 11b above the level of the body surface 10a.

Specific process embodiments will now be described.

Figure 3:
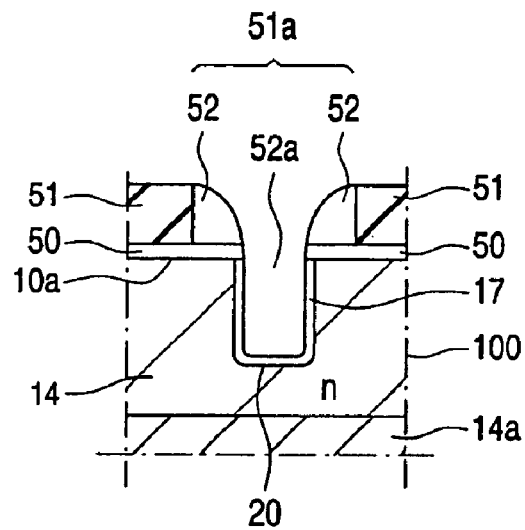
FIGS. 3 to 5 are cross-sectional views of a gate trench area of a device such as that of FIG. 1, at successive stages in its manufacture by one example of a method in accordance with the invention, wherein the silicide is deposited.

Process Embodiment of FIGS. 3 to 5

This embodiment is one example of a modification in accordance with the present invention of the advantageous self-aligned process of U.S. Pat. No. 6,087,224, involving sidewall extensions (commonly termed "spacers").

In this embodiment, the window provided in step (a) is a wide window 51a that is narrowed to a narrower window 52a by providing spacers 52 (for example of silicon dioxide) at the sidewalls of the wide window 51a in mask 51 (for example of silicon nitride). The cell pitch and the layout geometry of the device is determined by the layout pattern of the mask 51 that is defined in known manner by photolithographic and etching techniques. Spacers 52 are self-aligned with the sidewalls of the wide window 51a, as in U.S. Pat. No. 6,087,224. The gate trench 20 is etched in step (b) at the narrower window 52a.

Typically, the nitride mask 51 may be about 0.5 $\mu$m (micrometre) thick on a very thin (about 40 nm thick) oxide 50. In a device having a cellular pitch Yt of about 1 $\mu$m or less, the width w of the trench 20 may be about 0.2 $\mu$m. In this case, the window 51a may be 0.5 $\mu$m wide, as well as 0.5 $\mu$m deep. The oxide spacers 52 may each be from 0.1 $\mu$m to 0.2 $\mu$m wide, so that the window 52a is 0.2 $\mu$m wide.

FIG. 3 illustrates the structure resulting from the etching of the trench 20 and the provision of the gate dielectric 17. The gate dielectric layer 17 can be formed by either deposition or oxidation. Channel-accommodating region 15 and source region 13 are not shown in FIG. 3, because of the various options as to how and when the doping for these regions 13 and 15 can be provided, as disclosed in U.S. Pat. No. 6,087,224. Thus, for example, the doping for the region 13 and/or region 15 may be provided either before or after forming the trench-gate 11, and either a shallow or deep more highly-doped contact region 35 may be provided (also in a self-aligned manner) in the channel-accommodating region 15. In all cases, the source region 13 is self-aligned with the trench-gate by means of the spacers 52, in accordance with the teaching in U.S. Pat. No. 6,087,224.

Depending on how the source region 13 is defined, the spacers 52 may be removed after or before filling the insulated trench 20 with the poly-Si gate material 11'. The poly-Si gate part 11a is defined by etching back the material 11' to the level shown in FIG. 4, i.e. to about the level of the surface 10a. A desired conductivity doping of the semiconductor gate part 11a may be done during the deposition of material 11' or subsequently before providing the silicide.

Because the oxide spacers 52 may be thinned (i.e. the window 52a may be widened) slightly by the etching processes used to form the trench 20 and the gate part 11a, these spacers 52 are preferably replaced before providing the silicide part 11b. By etching away the oxide spacers 52 the wide window 51a is re-opened in the nitride mask 51. Further spacers 52x, for example of silicon dioxide, may then be formed at the sidewalls of this wide window 51a to form a further window 52y which defines at least the lateral extent of the gate part 11b.

A metal silicide material 11b' is then deposited and etched back to the level shown in FIG. 5, so as to leave the silicide upstanding part 11b of the trench-gate 11 in the window 52y. This further window 52y is preferably narrower than the width w of the trench 20 so that the silicide part 11b is spaced from the insulated walls of the trench 20. The deposited silicide material may be a silicide of, for example, tungsten, tantalum, zirconium, titanium or cobalt.

The insulating overlayer 18 is then provided. This may be effected by removing the further spacers 52x to form a new window between the masking pattern 51 and the upstanding silicide part 11b, and then depositing insulating material (for example silicon dioxide 18) over the silicide upstanding part 11b and in the new window. Alternatively, the oxide spacers 52y could be kept as side parts of the insulating overlayer 18. In this case, further insulating material is deposited (or otherwise provided) on top of the silicide part 11b in the window 52y to complete the insulating overlayer 18.

The nitride masking pattern 51 is then removed before providing a highly-doped contact region 35 of the channel-accommodating region 15 and depositing the source electrode 33 to contact this region 35 and the source region 13. Typically, this electrode comprises a thick layer of aluminium on a silicide contact layer 33a. Its layout is defined (by known photo-lithographic and etching techniques) into separate metallisation areas forming source electrode 33 and also a gate bondpad that is connected to the trench-gate 11. The gate bondpad metallisation and its connection are outside the plane of the FIG. 1 drawing.

The back surface 10b is then metallised to form the drain electrode 34, after which the wafer body 100 is divided into the individual device bodies 10.

Process Embodiment of FIGS. 3, 6 and 7

This embodiment is a different example in accordance with the present invention, using the advantageous self-aligned process of U.S. Pat. No. 6,087,224, with spacers 52 to form a narrow trench 20. This embodiment may use the same two-part mask 51 and 52 of different, selectively etchable materials (nitride and oxide), as in FIGS. 3 to 5. However, preferably the oxide spacer 52 is formed on an additional thin nitride layer 52z.

The two-part mask 51 and 52 is used when etching the trench 20, as in FIG. 3 of the previous embodiment. It is also used when filling the insulated trench 20 with poly-Si gate material. Thus, the poly-Si material 11' for the gate 11 is deposited in the insulated trench 20 at the narrow window 52a in this two-part mask 51 and 52 and over this two-part mask 51 and 52. FIG. 6 illustrates that the etch-back of the poly-Si 11' in this embodiment is stopped at a higher level (compared with FIG. 4) so as to leave an upstanding poly-Si part 11z integral with the part 11a. This part 11z protrudes above the level of the surface 10a, i.e. it is bounded by the spacers 52. Although shown lower in FIG. 6, the part 11z may protrude as high as the top of the mask 51 and 52.

The two-part mask 51 and 52 has a further use in this embodiment, as illustrated in FIG. 7. As in the previous embodiment of FIGS. 3 to 5, the oxide spacers 52 are removed before providing the metal silicide material in step (d). However, in this embodiment of FIGS. 3, 6 and 7, the silicide part 11b is not deposited. Instead, a silicide-forming metal 110 is deposited and is alloyed into the upstanding poly-Si part 11z. This metal 110 may be, for example, tungsten, tantalum, zirconium, titanium or cobalt.

Thus, as illustrated in FIG. 7, the removal of the oxide spacers 52 creates a space for the silicide-forming metal 110 to contact the sidewalls as well as the top of the upstanding part 11z. If desired, this space may be increased by a short dip etch of the upstanding poly-Si part 11z after removal of the spacers 52. The metal 110 is then deposited and alloyed into the poly-Si upstanding part 11z from its top and from its sidewalls. This alloying can be effected quickly and efficiently using RTA (rapid thermal annealing, using high-intensity light pulses) to heat the metal layer 110 over the device structure. By using RTA, the extent to which the metal is alloyed below the upstanding part 11z can be precisely controlled, while also avoiding significant heating of the device structure (especially the regions 13, 14 and 15) under the metal layer 110. During the alloying the thin nitride layer 21z protects the source-region area. With a thickness of, for example, at least 0.5 $\mu$m for the mask 51, the protrusion z of the alloyed silicide part 11b above the level of the surface 10a can easily be made larger than the narrow trench width w.

Thereafter the un-silicided metal 110 is etched away so as to leave the protruding partially-silicided gate 11b and 11a. The device structure is then further processed as in the previous embodiment.

Process Embodiment of FIGS. 8 to 10

This embodiment is similar in outcome to that of FIGS. 3, 6 and 7, in producing a partially-silicided trench-gate 11b and 11a, protruding from the semiconductor body 100. It uses a two-part mask 510 and 520 of different, selectively etchable materials (nitride and oxide). However, it does not use the self-aligned spacer process of U.S. Pat. No. 6,087,224. Thus, in this embodiment, window 510a at which the trench 20 is etched is present in both parts 510 and 520 of the two-part mask.

FIG. 8 shows a vertical arrangement of an upper layer 520 of, for example, silicon dioxide on a lower layer 510 of, for example, silicon nitride on a thin oxide layer 50 on the silicon body surface 10a. A comparison can be made with oxide 52 on nitride 52z on oxide 50 in FIG. 6. The thickness of the upper layer 520 determines the height of the silicide part 11b. In order to provide a good volume of silicide material, the upper layer 520 is made thicker, for example at least 5 times thicker, than the lower layer 510. As a result, the protrusion z of the silicide part 11b above the level of the surface 10a can easily be made larger than the trench width w.

In step (a) of this embodiment, photolithographic and etching techniques are employed to provide a window 510a through both layers 520 and 510 where the trench-gate 11 is to be formed in the body 100. This window 510a may first be used, for example, for providing the source-region dopant in the body 100a. This dopant can be diffused laterally beyond where the trench 20 is to be etched, so defining the source region 13 in a self-aligned manner with respect to the gate trench. However, the source region 13 can be provided in other known ways at earlier or later stages in the manufacture.

At this window 510a, the gate trench 20 is etched into the body 100. By deposition or oxidation, the gate dielectric layer 17 is provided at the walls of the trench 20. The resulting structure is shown in FIG. 8.

Poly-Si gate material 11' is then deposited and etched back so as to remain in the trench 20 and in the window 510a, as shown in FIG. 9. In this case, the etch-back is a planarising process, i.e. it is stopped when the upstanding poly-Si upper part 11z is level with the upper surface of the upper layer 520 of the mask. The oxide upper layer 520 is then etched away from the nitride lower layer 510. This exposes the sidewalls of the upstanding poly-Si upper part 11z that protrudes above the adjacent surface of the nitride layer 510. Thereafter, a silicide-forming metal 110 is deposited over the silicon gate material and nitride layer 510.

Then, as illustrated in FIG. 10, at least the metal 110 is heated (preferably by RTA) to grow the metal silicide into the silicon gate material from the top and side-walls of the upstanding upper part 11z. The silicide-forming metal 110 may be, for example, tungsten, tantalum, zirconium, titanium or cobalt. The nitride mask layer 510 protects the underlying device structure against alloying with the metal 110. After converting the poly-Si part 11z into the silicide gate part 11b in this manner, the remaining un-silicided metal 110 is removed from the device structure. The device structure is then further processed as in the previous embodiment.

Further Embodiments with Other Modifications

It will be evident that many other modifications and variations are possible for devices and manufacturing methods in accordance with the invention.

In the embodiments as described so far, the insulating over-layer 18 is deposited over the top and side-walls of the silicide upstanding part 11b of the trench-gate 11. However, as indicated by broken outlines in FIG. 2, over-layer 18 may comprise an insulating oxidised surface part 18b of the silicide material, adjacent to the top and sidewalls of the silicide upstanding part 11b.

Several metal silicides suitable for forming the upstanding gate part 11b are also suitable for oxidation to form insulator part 18b, for example, silicides of refractory metals titanium, zirconium, niobium and tungsten. Another part 18a may be, for example, deposited silicon dioxide. In some cases, the whole of the over-layer 18 may be an insulating oxidised part 18b of the metal silicide material of the upstanding gate part 11b. The nitride layer 520 can be used to mask the underlying silicon body surface 10a from oxidation during the growth of the insulating oxide 18b from the silicide part 11b.

In the process embodiments of FIGS. 3 to 7, the insulating overlayer 18 may even be formed by insulating spacers 52,52x at the sidewalls of the silicide upstanding part 11b and by an oxidised silicide layer 18b' grown into the top of the silicide upstanding part 11b in the window 52,52y. Nitride layer 51 (and 52z, when present) can be used to mask the underlying body surface 10a from oxidation during the growth of this insulating oxide 18b'.

In the embodiments of FIGS. 3 to 7, the source region 13 is formed most conveniently by dopant ion implantation and/or diffusion at windows formed by removing the spacers 52. However, the spacers 52 may be used in other ways to provide self-alignment of the source region 13 with the trench-gate 11. Thus, the source region 13 may be diffused into the body 100 from an arsenic or phosphorus doping in the spacers 52 themselves. In another alternative, the source region 13 may be formed by etching through an n-type layer 13' provided at the surface 10a before the mask 51. This layer 13' can be etched through to the underlying region 15 after providing the insulating overlayer 18 over the protruding gate 11. In these cases and others (for example, FIGS. 8 to 10), the insulating overlayer 18 can be subsequently etched back slightly to increase the exposed area of source region 13 for contacting with the electrode 33.

In the FIG. 10 embodiment, the poly-Si part 11z can be dip-etched in an isotropic etchant before depositing the metal layer 110, thereby laterally spacing the silicide part 11b from the walls of the trench. It is also possible to add spacers 52x to a two-layer mask 510,520 so as to narrow the area of the trench-etch window 510a where the silicide part 11b is provided, thereby laterally spacing this silicide from the walls of the trench.

The devices so far described are MOSFETs in which the higher-doped region 14a is of the same conductivity type (n-type in this example) as the drain drift region 14. However, the higher-doped region 14a may be of opposite conductivity type (p-type in this example) to provide an IGBT. The electrode 34 is called an anode electrode in the case of an IGBT.

Instead of forming the drain-drift region 14 by an epitaxial layer on a higher-doped substrate 14a, the higher doped region 14a of some devices may be formed by dopant diffusion into the back surface 10b of a high-resistivity substrate that provides the drift region 14.

A vertical discrete device has been illustrated with reference to FIG. 1, having its second main electrode 34 contacting the substrate or other region 14a at the back surface 10b of the body 10. However, an integrated device is also possible in accordance with the invention. In this case, the region 14a may be a doped buried layer between a device substrate and the epitaxial low-doped drain region 14. This buried layer region 14a may be contacted by an electrode 34 at the front major surface 10a, via a doped peripheral contact region which extends from the surface 10a to the depth of the buried layer.

The particular examples described above are n-channel devices, in which regions 13 and 14 are of n-type conductivity, region 15 is of p-type, and an electron inversion channel 12 is induced in the region 15 by the gate 11. In this case, the semiconductor gate part 11a is n-type. By using opposite conductivity type dopants, a p-channel device can be manufactured by a method in accordance with the invention. In this case, regions 13 and 14 are of p-type conductivity, region 15 is of n-type, the gate part 11a is p-type, and a hole inversion channel 12 is induced in the region 15 by the gate 11.

Semiconductor materials other than silicon may be used for devices in accordance with the invention, for example silicon carbide.

From reading the present disclosure, other variations and modifications will be apparent to persons skilled in the art. Such variations and modifications may involve equivalent and other features which are already known in the art and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

What is claimed is:

1. A method of manufacturing a trench-gate semiconductor device having source and drain regions which are separated by a channel-accommodating region adjacent to the trench-gate, including the following sequence of steps:
   (a) providing at a surface of a semiconductor body a masking pattern having therein a window that is used for self-aligning a gate trench and parts of the gate formed in the subsequent steps (b) to (d);
   (b) etching the trench into the semiconductor body within the window, and forming a dielectric layer at the walls of the trench to provide a gate dielectric for capacitively coupling the gate to the channel-accommodating region,
   (c) depositing and then etching back semiconductor gate material to provide a semiconductor gate part on the dielectric layer in the trench without protruding above the masking pattern at the window, and
   (d) then providing at the window a thickness of metal silicide material at the top of the semiconductor gate part sufficient to form a silicide upstanding part of the gate having a top and sidewalls that protrude upward above the level of the body surface, the gate dielectric at least adjacent to the channel-accommodating region being protected from the metal silicide material by at least the semiconductor part of the gate and by the protrusion of its silicide part above the level of the body surface.

2. A method according to claim 1, wherein the said window of the masking pattern provided in step (a) is a wide window that is narrowed to a narrower window by providing sidewall extensions at the sidewalls of the wide window, the trench is etched in step (b) at the narrower window, and the source region is provided so as to be self-aligned with the trench-gate by means of these sidewall extensions.

3. A method according to claim 1, wherein, after the step (c), the following steps are carried out:
   sidewall extensions are provided at sidewalls of the window of step (a) to form a further window that is narrower than the width of the trench,
   the metal silicide material is deposited in the said further window in step (d) so as to form the silicide upstanding part of the trench-gate spaced from the walls of the trench,
   an insulating overlayer is provided over the silicide upstanding part of the trench-gate,
   and the masking pattern is then removed before providing a source electrode to contact the source region and to extend over the insulating overlayer over the trench-gate.

4. A method according to claim 1, wherein the semiconductor gate material provided in the trench in step (c) comprises polycrystalline silicon protruding above the level of the body surface, sidewalls of the protruding polycrystalline silicon are exposed, and a silicide-forming metal is then deposited on the protruding polycrystalline silicon and is alloyed into the sidewalls and top of the protruding polycrystalline silicon so as to form the silicide upstanding part on top of remaining silicon semiconductor gate material in the trench.

5. A method of manufacturing a trench-gate semiconductor device having source and drain regions which are separated by a channel-accommodating region adjacent to the trench-gate, including the following sequence of steps:
   (a) providing at a surface of a semiconductor body a masking pattern comprising upper and lower layers through which a window extends at an area of the body where the trench-gate is to be provided,
   (b) etching a trench for the gate into the body at the window, and forming a gate dielectric layer at the walls of the trench in the semiconductor body,
   (c) providing silicon gate material in the trench and in the window, and then removing the upper layer of the masking pattern such that the silicon gate material has an upstanding upper part that protrudes above the adjacent surface of the lower layer of the masking pattern,
   (d) depositing a silicide-forming metal over the silicon gate material and over the lower layer of the masking pattern, and heating at least the metal to grow a metal silicide into the silicon gate material from the top and side-walls of the upstanding upper part, and
   (e) removing the un-silicided metal so as to leave a partially-silicided trench-gate protruding from the semiconductor body.

6. A method according to claim 5, wherein the upper layer of the masking pattern is thicker, for example at least 5 times thicker, than the lower layer.

7. A method according to claim 5, wherein the upper layer of the masking pattern comprises silicon dioxide, and the lower layer comprises silicon nitride on a thinner layer of silicon dioxide on the semiconductor body surface.

8. A method according to claim 4, wherein the deposited silicide-forming metal is heated by rapid thermal annealing to form the silicide with the silicon gate material.

9. A method according to claim 1, wherein the surface of the metal silicide upstanding part is subsequently oxidised so as to grow an insulating oxide adjacent to the silicide, which insulating oxide forms at least a part of an insulating over-layer provided over the top of the protruding part of the trench-gate, and a source electrode is deposited on the insulating over-layer and on an exposed surface area of the semiconductor body beside the trench-gate after removing the lower layer of the masking pattern.

10. A method according to claim 9, wherein the masking pattern includes a silicon nitride layer that is used to mask the underlying body surface from oxidation during the growth of the insulating oxide adjacent to the silicide.

* * * * *